United States Patent [19]

Vandegraaf

[11] 4,347,484
[45] Aug. 31, 1982

[54] SYNTHESIZER HAVING AN INJECTION SYNCHRONIZED DIVIDER

[75] Inventor: Johannes J. Vandegraaf, Lynchburg, Va.

[73] Assignee: General Electric Company, Lynchburg, Va.

[21] Appl. No.: 155,386

[22] Filed: Jun. 2, 1980

[51] Int. Cl.³ .............................................. H03L 7/08
[52] U.S. Cl. ...................................... 331/25; 331/18; 331/51
[58] Field of Search ...................... 331/1 A, 17, 18, 25, 331/51

[56] References Cited

U.S. PATENT DOCUMENTS 3,813,610   5/1974   Kimura ........................... 331/25 X Primary Examiner—Siegfried H. Grimm
Assistant Examiner—Edward P. Westin
Attorney, Agent, or Firm—Cushman, Darby & Cushman

[57] ABSTRACT

A phase-locked loop circuit for use in locking onto a sub-harmonic of the frequency of a reference source. An oscillator operating at the sub-harmonic frequency is injection-synchronized to the primary voltage controlled oscillator of the phase-locked loop, thereby causing it to function as a divider. The injection-synchronized oscillator can be controlled by a loop control signal generated by the loop's phase detector and loop filter.

27 Claims, 10 Drawing Figures

SYNTHESIZER HAVING AN INJECTION SYNCHRONIZED DIVIDER

BACKGROUND OF THE INVENTION

This invention relates in general to phase-locked loops. More specifically, this invention relates to phase-locked loops wherein the loop is locked to a multiple of a reference oscillator frequency.

Phase-locked loops have become widely utilized in communication apparatus. They find specific application as frequency synthesizers and demodulators in transmitters and receivers.

Referring to FIG. 1, there is shown a block diagram of a conventional phase-locked loop. The conventional phase-locked loop includes a voltage controlled oscillator (VCO) 20, having a frequency of oscillation that is related to the magnitude of a VCO control signal applied to a control input 28 thereof. Voltage controlled oscillator 20 includes a high power output 30 serving as the phase-locked loop output and a lower power output 32. Low power output 32 provides a signal of the same frequency and phase as that provided by high power output 32 and is coupled through a divider 22 having a divide ratio N. The output of divider 22 is coupled to one of two signal inputs of a phase detector 24. The second signal input of phase detector 24 is coupled to the output of a reference source 26. The output frequency, $F_{REF}$, of reference source 26 is fixed, predetermined, and stable. Phase detector 24 provides at its output a signal corresponding to the phase difference between the signals applied to its two signal inputs. Thus, the output of phase detector 24 corresponds to the instantaneous difference in phase between the signal from the output of divider 22 and the signal from the output of reference source 26. The output of phase detector 24 is filtered by a loop filter 27, generally having a low pass characteristic. The filtered signal provided by loop filter 27 becomes the VCO control signal for the phase-locked loop and is coupled to control input 28 of voltage controlled oscillator 20. The loop output signal, taken from output 30 of voltage controlled oscillator 20, has a frequency $F_{OUT}$, where $F_{OUT} = N \cdot F_{REF}$.

In the conventional phase-locked loop system, as illustrated in FIG. 1, voltage controlled oscillator 20 becomes locked to N times the frequency of reference source 26. Theoretically, with appropriate selection of the frequency $F_{REF}$ of reference source 20, the loop filter 26 characteristic, the divide ratio N and the center frequency of voltage controlled oscillator 20, a loop could be designed to lock onto any desired frequency. However, as phase-locked loop systems are applied to the design of communications equipment operating at higher frequencies, particularly in the UHF range, it becomes more and more difficult to provide practical divider circuits that function effectively.

Conventional digital dividers are based upon powers of two and it is not commercially feasible to create odd power multiples. This problem alone severely limits their application.

Also, most digital dividers are packaged in dual in line packages which do not lend themselves to hybrid circuit construction. Furthermore, binary dividers are quite expensive and have a high current drain.

SUMMARY OF THE INVENTION

There is therefore provided a phase-locked loop circuit having multiple feedback that is capable of operation at much higher frequencies than those at which conventional phase-locked loops are operable. Also provided is an injection-synchronized voltage controlled oscillator for use as the divider in the phase-locked loop circuit.

The phase-locked loop circuit, according to the present invention, substitutes an injection-synchronized voltage controlled oscillator in place of divider 22 in order to perform the divide function. The injection-synchronized voltage controlled oscillator operates in a range of frequencies centered at a sub-multiple of the frequency of the primary voltage controlled oscillator. The injection-synchronized oscillator is also controlled by the VCO control signal coupled to the primary voltage controlled oscillator so that the two oscillators track one another under the control of the VCO control signal. Thus, once in lock, the two oscillators track so as to remain in lock in a predetermined range of the VCO control signal from the loop filter.

An injection-synchronized voltage controlled oscillator is provided for use in the phase-locked loop circuit according to the present invention. This injection-synchronized oscillator is tolerant to wide range of injection signal levels from the primary voltage controlled oscillator and has a wide lock range. Thus, it is capable of performing its divide function over a wide bandwidth.

BRIEF DESCRIPTION OF THE DRAWINGS

Many of the attendant advantages of the present invention will be readily apparent as the invention becomes better understood by reference to the following detailed description and the appended claims, when considered in conjunction with the accompanying drawings, wherein:

DETAILED DESCRIPTION OF THE PREFERRED EMBODIMENT

Figure 1:
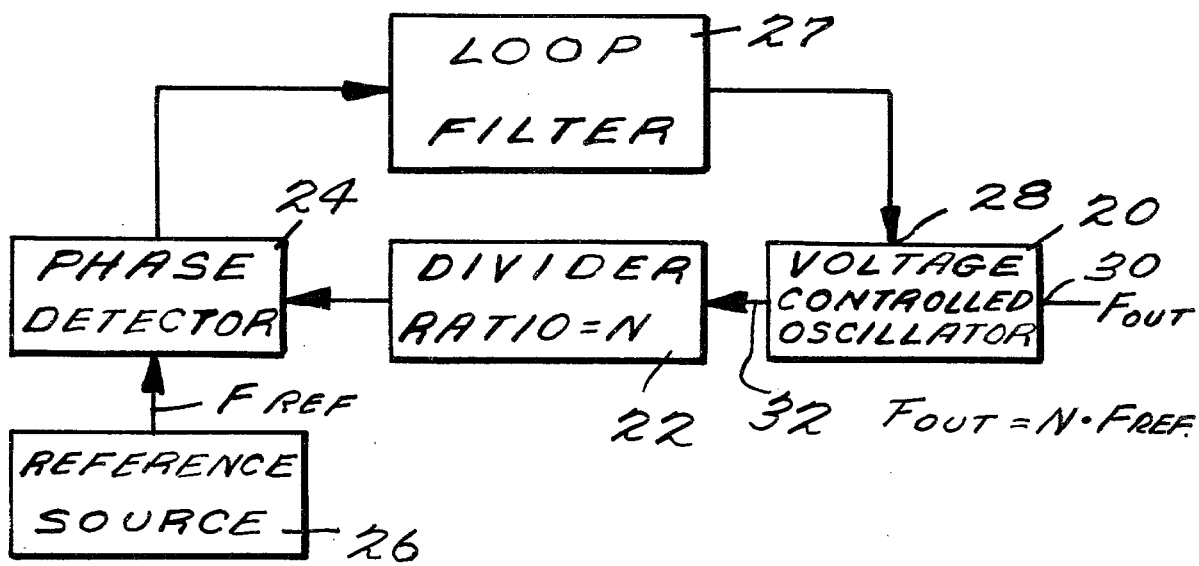
FIG. 1 is a block diagram of a conventional phase-locked loop.
Figure 2:
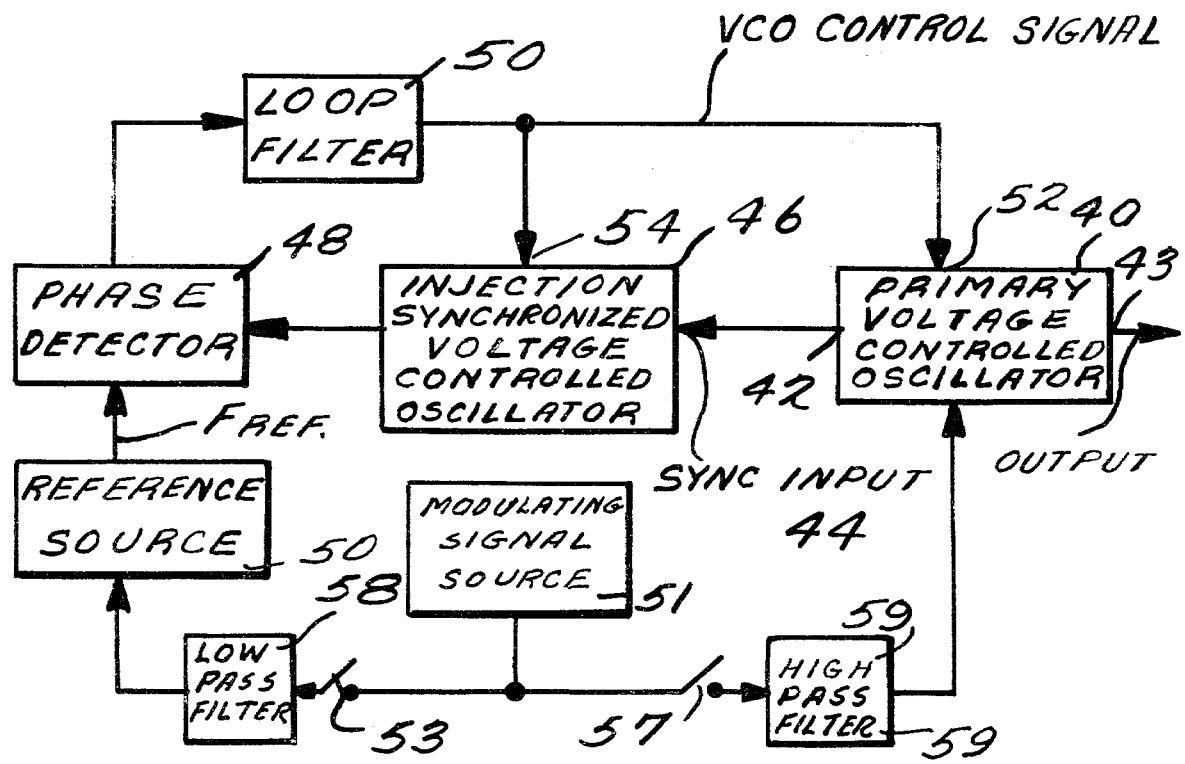
FIG. 2 is a block diagram of the phase-locked loop circuit according to the present invention.

Referring now to the Figures, wherein like reference numerals designate like or corresponding parts throughout, and specifically referring to FIG. 2, there is shown a general block diagram of the phase-locked loop according to the present invention. The phase-locked loop circuit, according to the present invention, includes a primary voltage controlled oscillator 40 having a first, low power, output 42 and a second, high power, output 43. Output 43 serves as the output of the phase-locked loop circuit. Primary voltage controlled oscillator 40 is analogous to voltage controlled oscillator 20 shown in the conventional phase-locked loop of FIG. 1. The signal from output 42 of primary voltage controlled oscillator 40 is coupled to a sync input 44 of an injection-synchronized voltage controlled oscillator 46. Injection-synchronized voltage controlled oscillator 46 operates at a sub-multiple of the frequency of primary voltage controlled oscillator 40. The output of injection-synchronized voltage controlled oscillator 46 is coupled to one signal input of a phase detector 48. The second input of phase detector 48 is coupled to a reference source 50 having frequency $F_{REF}$, that is predetermined, fixed, and stable. The output of phase detector 48 is, as in a conventional phase-locked loop, a function of the phase difference between the two input signals coupled thereto. The output signal of phase detector 48 is filtered by a loop filter 50, generally having a low pass frequency characteristic. The output of loop filter 50 is the VCO control signal for the phase-locked loop and is coupled to both a control input 52 of primary voltage controlled oscillator 40 and to a control input 54 of injection-synchronized voltage controlled oscillator 46. Primary voltage controlled oscillator 40 and injection-synchronized voltage controlled oscillator 46 are designed so that they will track under the action of the VCO control signal applied to their respective input.

Injection-synchronized voltage controlled oscillator 46 functions as a frequency divider within the phase-locked loop. It is a locked oscillator running at a sub-multiple of the frequency of primary voltage controlled oscillator 40. By utilizing an injection-synchronized voltage controlled oscillator 46, large division ratios can be achieved, with even or odd divide ratios and at a frequency range suitable for UHF phase-locked loops.

The system of FIG. 2 may be used to vary the output frequency of primary voltage controlled oscillator 44 in response to a modulating signal input applied to reference source 50 from a modulating signal source 51 upon the closing of switch 53. Modulating signal source 51 would have to provide a modulating signal within the bandwidth limits of the control loop.

In the alternative, primary voltage controlled oscillator 40 can be frequency modulated directly by signals from a modulating signal source 51 upon the closing of a switch 57. In this manner if the loop bandwidth is too narrow to permit modulation of reference source 50, primary voltage controlled oscillator 44 may still be modulated by signals from modulating signal source 51.

By modulating both reference source 50 and primary voltage controlled oscillator 40 through appropriate low pass and high pass filters 58 and 59, respectively, from common modulating signal source 51, the useful overall range of frequency modulation which can be accommodated is extended. The filters would be selected such that the low pass filter is below the tracking bandwidth of the phase-locked loop and the high pass filter would be above.

Figure 3:
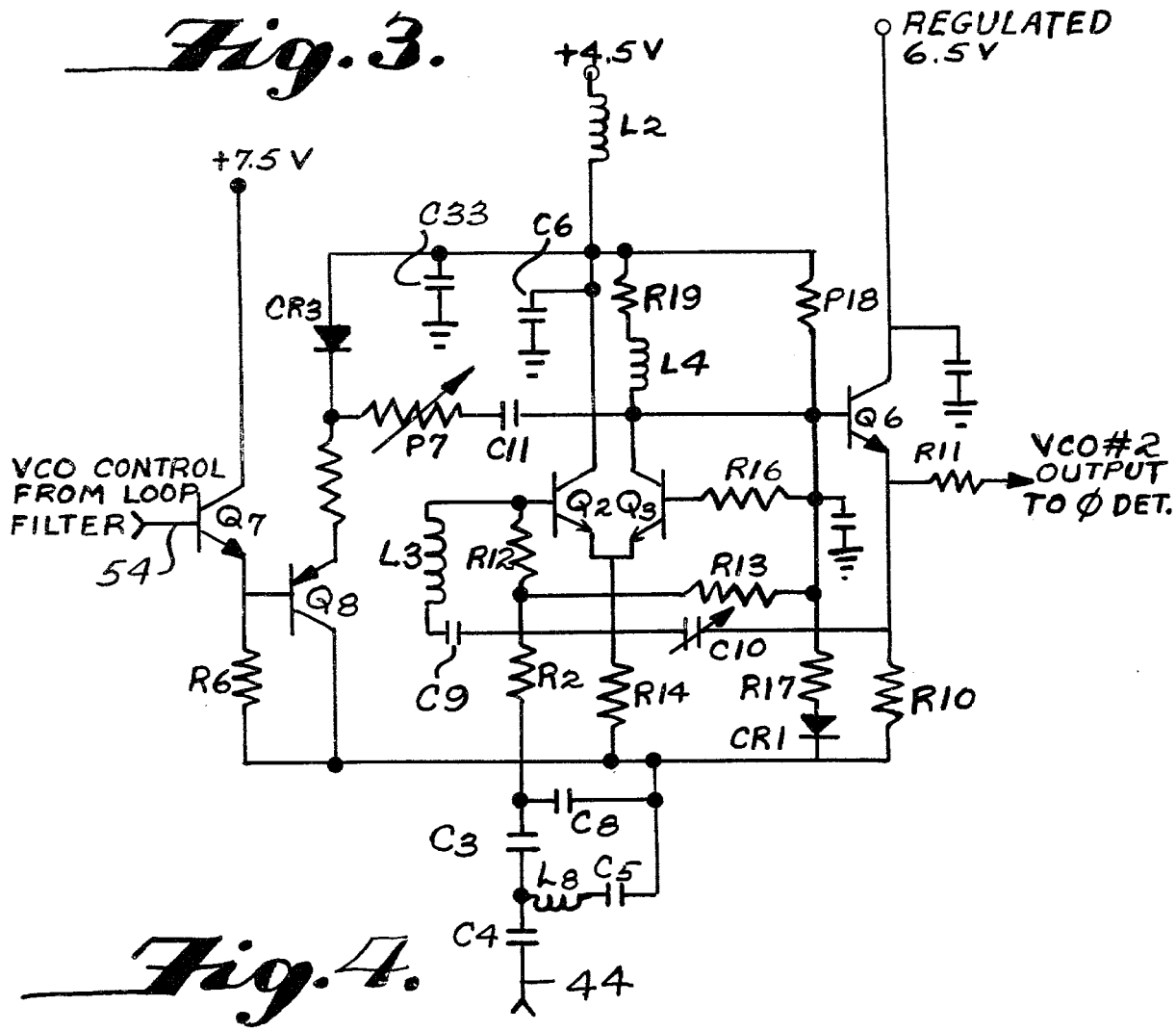
FIG. 3 is a detailed schematic diagram of the injection-synchronized voltage controlled oscillator according to the present invention.

Referring now to FIG. 3 there is shown a detailed schematic diagram of injection-synchronized voltage controlled oscillator 46. This detailed schematic diagram is the presently preferred and best mode embodiment of injection-synchronized voltage controlled oscillator 46 and is intended to be locked to the fifth subharmonic of primary voltage control oscillator 40, operating at 450 MHz. Therefore, second voltage control oscillator 46 is operating at 90 MHz and the output frequency of reference source 50 is 90 MHz. The particular circuit arrangement shown in FIG. 3 is suitable for locking onto odd submultiples (3, 5, 7) to achieve odd division ratios. However, by suitable modification of the particular circuit arrangement, even division ratios (2, 4, 6, etc.) can be achieved. The design principles related to injection-synchronized oscillator 40 are discussed in detail with reference to FIGS. 4-9 so as to enable one of ordinary skill in the art to adapt the circuit shown in FIG. 3 to other frequency ranges and divide ratios.

Injection-synchronized oscillator 40 is built around a differential amplifier including transistors Q2 and Q3. A third transistor Q6 is a unity gain emitter follower stage for providing a low impedance output for coupling to phase detector 48. Thus, the basic oscillator circuit includes transistors Q2, Q3 and Q6 along with their associated components. A frequency control circuit responsive to the VCO control signal is formed by capacitor C11, resistor R7, RF diode CR3, and transistors Q7, and Q8 along with their associated biasing resistors. The oscillating frequency range is established by a low Q series RLC feedback circuit including capacitor C9, capacitor C10, inductor L3, resistor R12, and resistor R13. The series combination of resistor R19 and inductor L4 couples power to the collector of transistor Q3. Inductor L4 tunes out the parametric capacity of the collector of transistor Q3. The presence of inductor L4 is not essential but it improves the operation of the oscillator at high frequencies (above 100 MHz).

The synchronizing signal from primary voltage controlled oscillator 40 is introduced through sync input 44 into the feedback circuit via a band pass filter including inductor L8, capacitor C5, capacitor C3, capacitor C4 and capacitor C8 and through an isolation resistor R2 and through resistor R12 of the feedback circuit. The path to RF ground via inductor L3, capacitor C9, and capacitor C10 presents a high impedance to the synchronizing signal from primary voltage controlled oscillator 40. Resistors R2 and R13 from a voltage divider for setting the injection signal level from the synchronizing input.

The arrangement of transistors Q2, Q3 and Q6, with their associated components constitutes a positive feedback circuit which oscillates approximately at the center frequency of the RLC feedback network. A resistor R14 couples the emitters of transistors Q2 and Q3 to RF ground. The current in resistor R14 is fixed. Therefore, the oscillator output is a trapezoidal wave, the rise and fall times of which are limited by the output capacity of transistor Q3. The frequency of oscillation of injection-synchronized voltage control oscillator 46 is controlled by changing the effective capacitance presented to the collector of transistor Q3. This changing of effective capacitance is accomplished by changing the effective resistance of diode CR3 which is a low capacitance RF diode. The effective resistance of diode CR3 is changed by drawing more or less current through the diode from transistor Q8.

Transistors Q7 and Q8 form, in effect, a cascaded complementary emitter follower stage. If the voltage of the VCO control signal from the loop filter 50, coupled to the base of transistor Q7, is low, the current in transistor Q8 is high and the AC resistance of diode CR3 is low. When the AC resistance of diode CR3 is low, the collector of transistor Q3 sees substantially the susceptance of capacitor C11 to ground. Resistance R7 is a trim resistance for setting the frequency excursion limits.

As an alternate arrangement, trimming can be accomplished by changing the value of capacitor C11 however, that is not particularly convenient in the present schematic arrangement. When the synchronizing signal induces a high current transistor Q8 and the AC resistance of diode CR3 is low, the collector of transistor Q3 sees the susceptance of capacitor C11 to ground. This causes the frequency of oscillation to be lowered. Conversely, if the voltage of the VCO control signal is high, diode CR3 is essentially turned off. The oscillator then sees the series combination of capacitor C11 and the residual capacitance of diode CR3 (less than 1 pf). Thus, the oscillation frequency is raised.

The circuit is arranged such that as the control voltage is increased from 2 to 5 volts, the frequency of each of primary voltage controlled oscillator 40 and injection-synchronized voltage controlled oscillator 46 is maintained in approximately a 5 to 1 ratio, thereby allowing the synchronizing signal coupled to sync input 44 of the injection-synchronized voltage controlled oscillator to maintain lock.

For good lock of performance, it is desirable that the feedback signal at the base of transistor Q2 be substantially sinusoidal while maintaining a circuit Q that is not higher than is absolutely necessary. The circuit Q in this particular schematic arrangement is defined by $$Q = \omega L/(R12 + R13)$$

With circuit Q minimized, the stored energy in the feedback circuit is also minimized. If the feedback signal is not sinusoidal, the lock in range becomes unsymmetrical. That is, if the frequency of the primary voltage controlled oscillator 40 is higher than divide ratio multiple of the free-running frequency of injection-synchronized controlled oscillator 46, then the lock range is larger than if the frequency of the primary voltage controlled oscillator is lower than the divide ratio multiple of the free running frequency of the injection-synchronized voltage controlled oscillator. Since the circuit Q is kept as low as possible, it is important that operating voltages be stable. Also it is necessary that the collector supply voltage for transistor Q6 be higher than that for transistor Q2 to minimize the input capacitance of transistor Q6. To this end, a regulated voltage supply (not shown) is utilized to stabilize the voltage applied to transistor Q6 to about 6.5 volts regardless of any change of voltage level of the primary DC supply of 7.5 volts supplied to the collector of transistor Q7. The output of transistor Q6 is coupled through a resistor to loop phase detector 48. Capacitor C10 is utilized to set the free running frequency.

As stated, the circuit configuration shown in FIG. 3 operates at 90 MHz so as to be injection-synchronized to the fifth subharmonic of a 450 MHz primary voltage controlled oscillator. In order to operate at different divide ratios and different frequency ranges, it is necessary to alter the circuit arrangement and component values. Such alternatives can be made by utilizing basic design principles set forth with reference to FIGS. 4-9.

Figure 4:
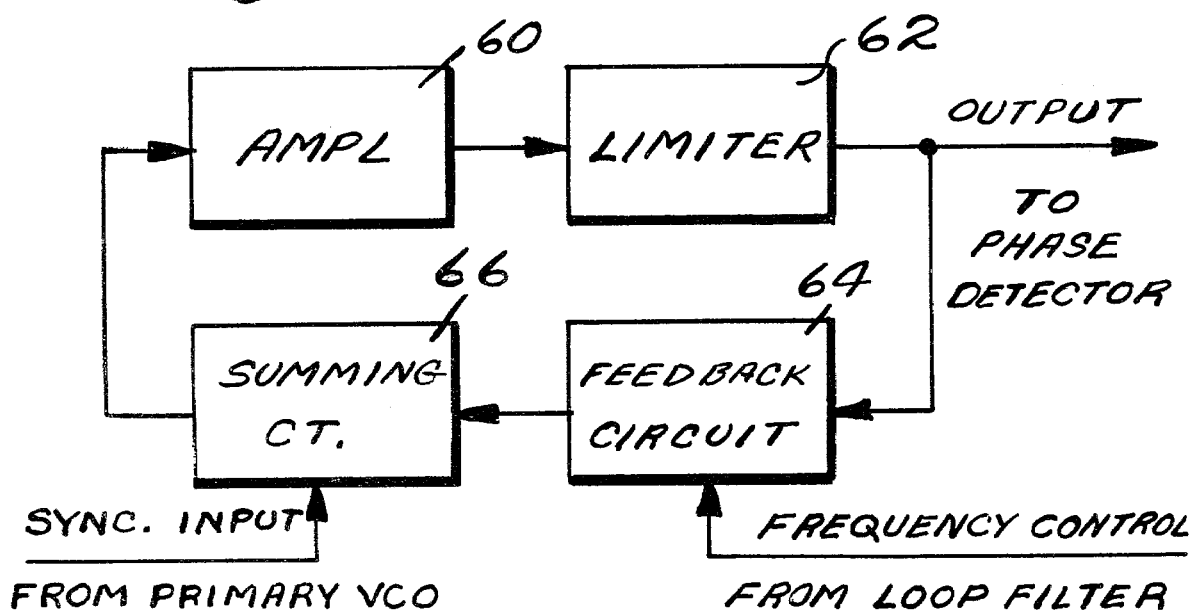
FIG. 4 is a functional block diagram of the injection-synchronized voltage controlled oscillator, according to the present invention.

Referring now to FIG. 4, there is shown a functional block diagram of an injection-locked voltage controlled oscillator according to the present invention. Injection-synchronized voltage controlled oscillator 46 can be conceptualized as an amplifier 60, a limiter 62, a feedback circuit 64 providing positive feedback around the amplifier, and a summing circuit 66. In practical embodiments, the functions of amplifier 60 and limiter 62 are implemented by a differential amplifier, such as that formed by Q2 and Q3 in the FIG. 3 schematic.

The operating characteristics of injection-synchronized voltage controlled oscillator 46, such as oscillating frequency and frequency stability are primarily determined by the nature of the feedback circuit 64. Feedback circuit 64 can either be a high pass or a band pass configuration. A low pass configuration is not feasible because the overall phase-locked loop circuit would merely latch up due to the positive feedback, assuming that the frequency response of the amplifier extends down to DC. The basic functional block diagram of FIG. 4 is further detailed into a schematic diagram in FIG. 5.

Figure 5:
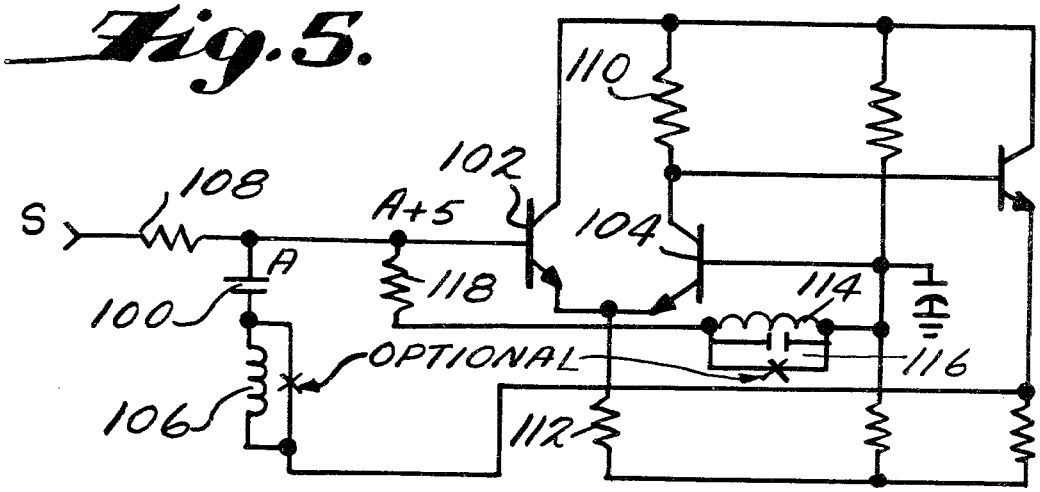
FIG. 5 is a schematic diagram of a basic relaxation oscillator circuit useful in designing alternative embodiments of the injection-synchronized voltage controlled oscillator shown in FIG. 3.

Referring now to FIG. 5, there is shown a schematic diagram of an oscillator illustrating the basic form of injection-synchronized voltage controlled oscillator 46. The use of a simple single RC high pass circuit as the feedback circuit would turn this oscillator into an astable multi-vibrator having waveforms similar to those shown in FIG. 6. A circuit of this type is referred to as a relaxation oscillator. From one cycle to the next there is little or no energy storage in the frequency determining element (capacitor 100 is discharged). This is a contrast to the resonator type feedback circuit which utilizes a series LC circuit instead of capacitor alone. Using a resonator type feedback circuit, there can be substantial energy storage in the feedback circuit itself. Thus, if the feedback loop were open, the resonant circuit would ring for a number of cycles depending upon the damping of the circuit. A typical astable oscillator utilizes a high Q resonator. Such a circuit can only be injection locked over a very narrow frequency range. In theory, any oscillator can be synchronized by an exterior signal source if the external signal source is a multiple of the oscillating frequency. However, an oscillator operating in the relaxation or quasi-relaxation mode exhibits superior lock performance. Generally, the synchronizing signal (reference S in FIG. 5) is combined with the feedback signal into the input of the limiting amplifier.

Figure 6:
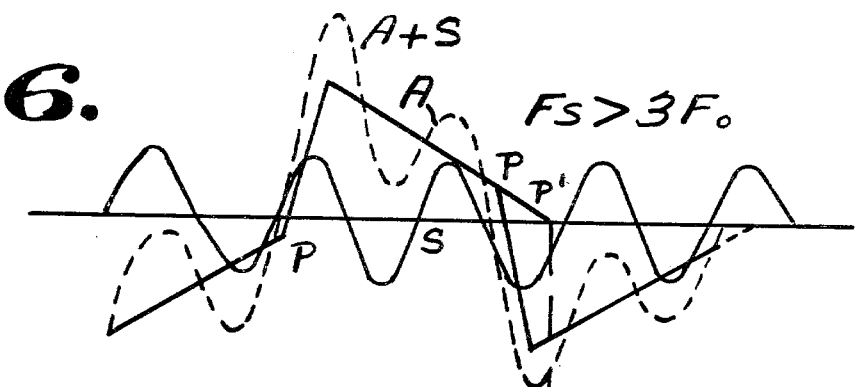
FIGS. 6-8 are a series of waveforms explaining the operation of the relaxation oscillator shown in FIG. 5.

The circuit configuration shown in FIG. 5 is for a divide by three circuit using a simple RC feedback arrangement. The waveform labeled A in FIG. 6 represents the input to a differential amplifier consisting of transistors 102 and 104. Waveform A would be present even in the absence of a synchronizing signal input. Waveform S in FIG. 6 represent the synchronizing input having a frequency of approximately three times the frequency of waveform A which is the free running frequency $F_O$ of the oscillator. For the purpose of illustration, two separate cases are shown. The waveforms shown in FIG. 6 illustrate a synchronizing frequency $F_S$ greater than $3F_O$ and the waveforms shown in FIG. 7 demonstrate the situation where $F_S$ is less than $3F_O$.

Figure 7:
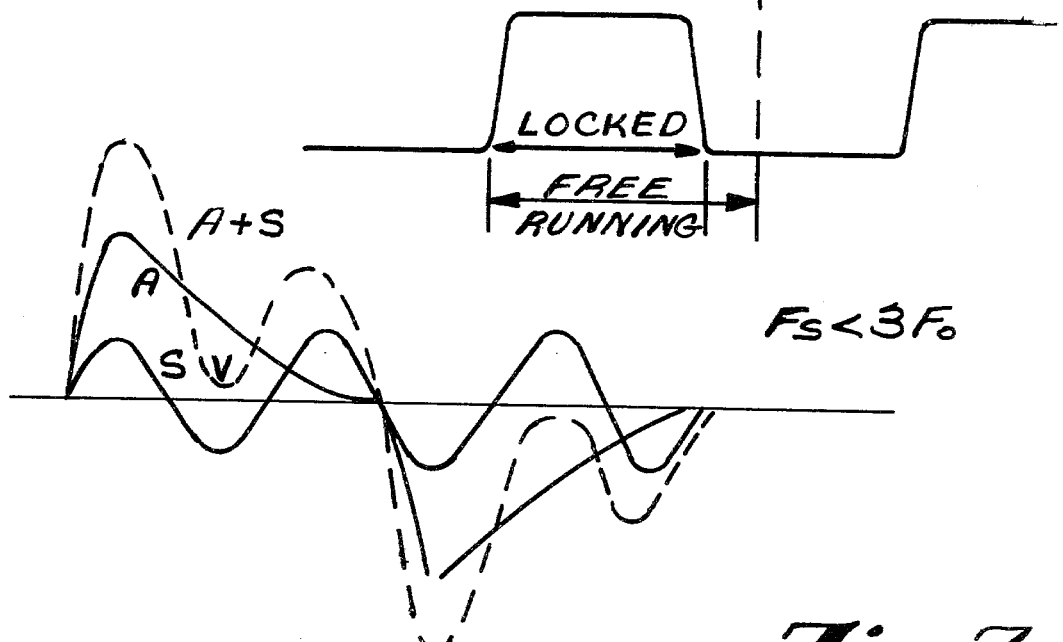
Figure 7:
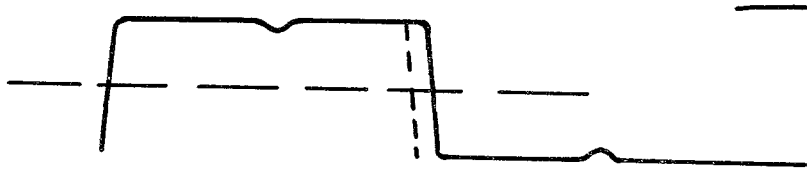

The composite input A+S shown in each of FIGS. 6 and 7 controls the switching of the limiting amplifier. The lower graphical representation in FIG. 6 depicts the output of the limiting amplifier.

Figure 8:
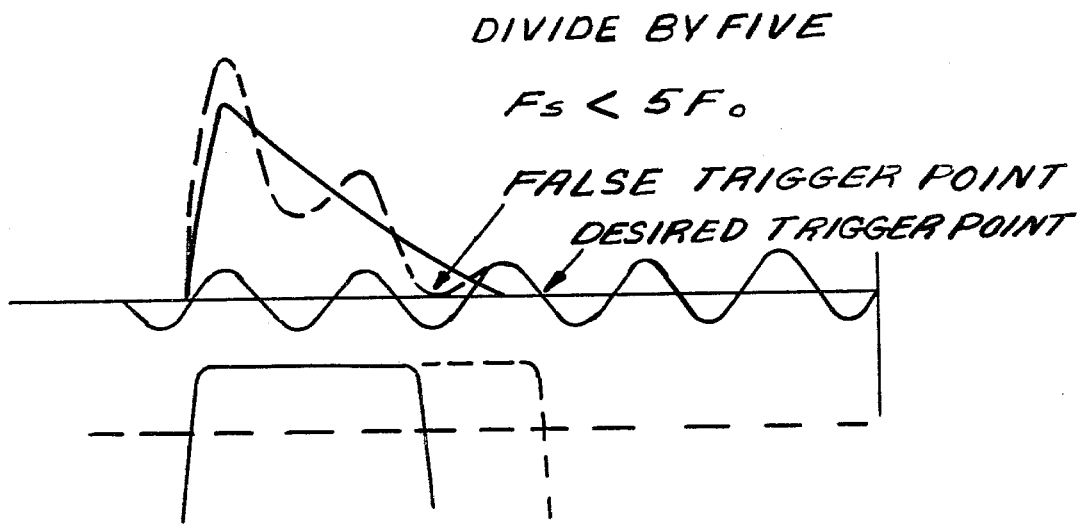

Examining these waveforms, two critical points can be discerned. These are shown as P and V. Point P is relevant where the oscillator must be locked high (where $F_S$ is greater than $3F_O$, as in FIG. 6). At this point the synchronizing signal input must counteract the discharge output from capacitor 100 in order to produce a signal of the opposite polarity for causing the limiting amplifier to switch and initiate a new cycle. If the magnitude of the sync input is too low, the oscillator will drop out of lock. The other critical point is the valley V. Point V occurs at the next peak excursion of the synchronizing input. If the synchronizing signal exceeds the discharge output of capacitor 100 in the opposite polarity, false triggering will occur with the resultant loss of lock. This is likely to occur in the case where the oscillator is to be locked at a frequency below its free running frequency. This phenomenon is due to the time assymmetry of the discharge waveform resulting in the oscillator being capable of lock over a much wider range above its free running frequency than below it. This situation can be improved by making the amplitude of the synchronizing input frequency dependent (by increasing its magnitude as a function of frequency). This renders the discharge waveform more symmetrical. These problems will be accentuated if a higher order division is attempted. In FIG. 8, the waveforms are shown for a division by 5. The situation illustrating false triggering at the valley point is illustrated.

Waveform symmetry can be improved considerably by adding a series inductor 106 to the discharge circuit. (See FIG. 5.) The feedback circuit with inductor 106 included would be a series RLC configuration. The step response of this circuit is dependent upon the Q of the circuit where $$Q = \omega \cdot L/R,$$

and resembles a damped sinusoid.

Figure 9:
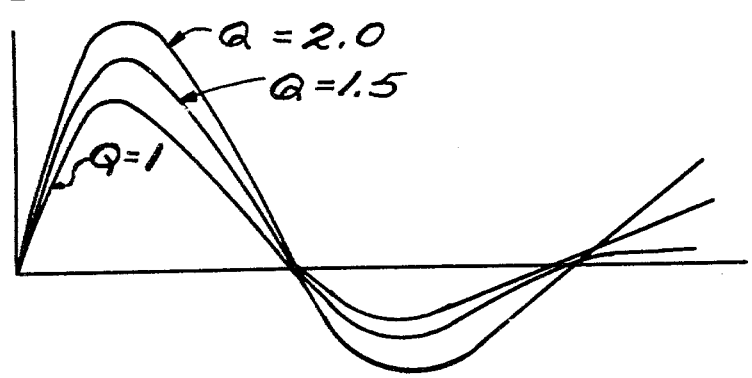
FIG. 9 is a graphical representation of the step response of an RLC circuit having various Qs, also explaining the operation of the relaxation oscillator shown in FIG. 5.

In FIG. 9, there is illustrated graphically a step input with the damped sinusoidal responses of an RLC circuit for various circuit Qs. It can be seen that for Q values above 1.5, the assymmetry is not too pronounced. However, the tails beyond the first zero crossing increase in amplitude. In actual operation of the circuit, the synchronizing input modifies the zero crossing but does not effect the energy stored within the feedback circuit which causes the ringing response at the natural frequency at the resonator. The interference between the sums of these tail responses and the forcing input from the synchronizing signal reduces the effective lock range. Generally, one is interested in the maximizing the total lock range. Therefore, there is nothing to be gained by increasing the Q values beyond a certain point. Although the symmetrical waveforms are helpful in preventing false triggering, the side effect of extended ringing counteracts this, if carried to excess with a high Q value.

A summing circuit (reference numeral 66 in FIG. 4) is needed to introduce the synchronizing signal into the feedback loop without affecting the amplitude of the feedback signal. In the circuit diagram shown in FIG. 5, the synchronizing signal is applied to the base of transistor 102 via an isolating resistor 108. In this manner, the switching output of transistor 104 is not affected. The switching output of transistor 104 is determined only by the supply voltage and the ratio of resistors 110 and 112. Without the presence of inductor 106, the synchronizing signal will be attenuated due to shunting effect of capacitor 100. This highlights another advantage of the series LC circuit.

In principle, the synchronizing signal can also be applied to the base of transistor 104. However, applying the synchronizing signal to the base of transistor 104 adds the signal to the square wave switching output which is not desirable. It may be desirable, for best lock performance, to provide a rising frequency response for the synchronizing signal. This can be done by providing a parallel resonant circuit including an inductor 114 and a capacitor 116 in series with a resistor 118 to RF ground. Its resonant frequency is set above the maximum input lock frequency. The effect of this resonant circuit at the oscillator frequency can be made small by the appropriate choice of component values.

In addition to being highly suitable for injection synchronizing, the basic oscillator circuit shown in FIG. 5 must also be voltage tuneable so as to be responsive to the VCO control signal. Furthermore, the tuning characteristics of primary voltage control oscillator 40 and of the injection-synchronized voltage controlled oscillator 46 have to track sufficiently well for reliable injection synchronization. The most straight forward manner of tuning the oscillator is to use a varicap in place of capacitor 100. Due to the large amplitude involved, two back-to-back varicaps must generally be used. Otherwise, the feedback signal becomes too distorted. Isolating capacitors and extra resistors are required for establishing a DC reference for the VARICAPs. However, such extra components introduce parasitic capacitance and inductance which can be troublesome at high operating frequencies (above 100 MHz). At lower frequencies (less than 30 MHz) parasitic capacitance and inductance does not present a substantial problem.

Of course, substituting a varicap for capacitor 100 is only one possible tuning method. The tuning method adopted in the particular design changes the effective capacitance to ground at the collector of transistor 104. The effect of the change of this capacitance is to make the waveform at this point more trapezoidal in shape, thereby stretching out the pulses. At UHF frequencies, any circuit has a finite rise time due to its unavoidable bandwidth limitations. The effective shunt capacitance to ground is changed by changing the RF impedance of a diode in series with a capacitor by controlling the circuit through a diode. If the diode is substantially turned off, its resistance is high and the parallel presentation of the circuit is a very small capacitance in parallel with a large resistance. However, if the diode resistance is small, compared with the reactance of the capacitor, the effect is that of a lossy capacitor. By the appropriate choice of component values and by appropriate control of the current through the diode as a function of the phase-locked loop control voltage, it is possible to achieve adequate tracking between the primary and injection-synchronized voltage controlled oscillators.

To summarize the operating characteristics of the basic circuit shown in FIG. 5, the circuit functions as a limiting amplifier having a low output impedance and a defined input impedance that is preferably high. It has a well defined peak-to-peak square wave or trapezoidal output waveform. The feedback circuit is either of the RC or series RLC type. Best performance is obtained utilizing an RLC circuit for division ratios above 3. The Q of the RLC circuit has some optimum value for best performance.

$$Q = \frac{\omega_o L}{R}, \text{ where } \omega_o \sqrt{L/C}$$

therefore, $$Q = \frac{\sqrt{L/C}}{R}$$

There is an optimum way to introduce the synchronizing signal, depending on the characteristics of the feedback circuit and the division ratio desired. Frequency shaping the synchronizing signal can be advantageous to achieve maximum lock range. A shaping network can be part of the feedback circuit. Voltage control of the oscillator can be accomplished in different ways which will depend on the method employed in the primary voltage controlled oscillator (voltage controlled oscillator 40) and on its frequency control characteristics.

Figure 10:
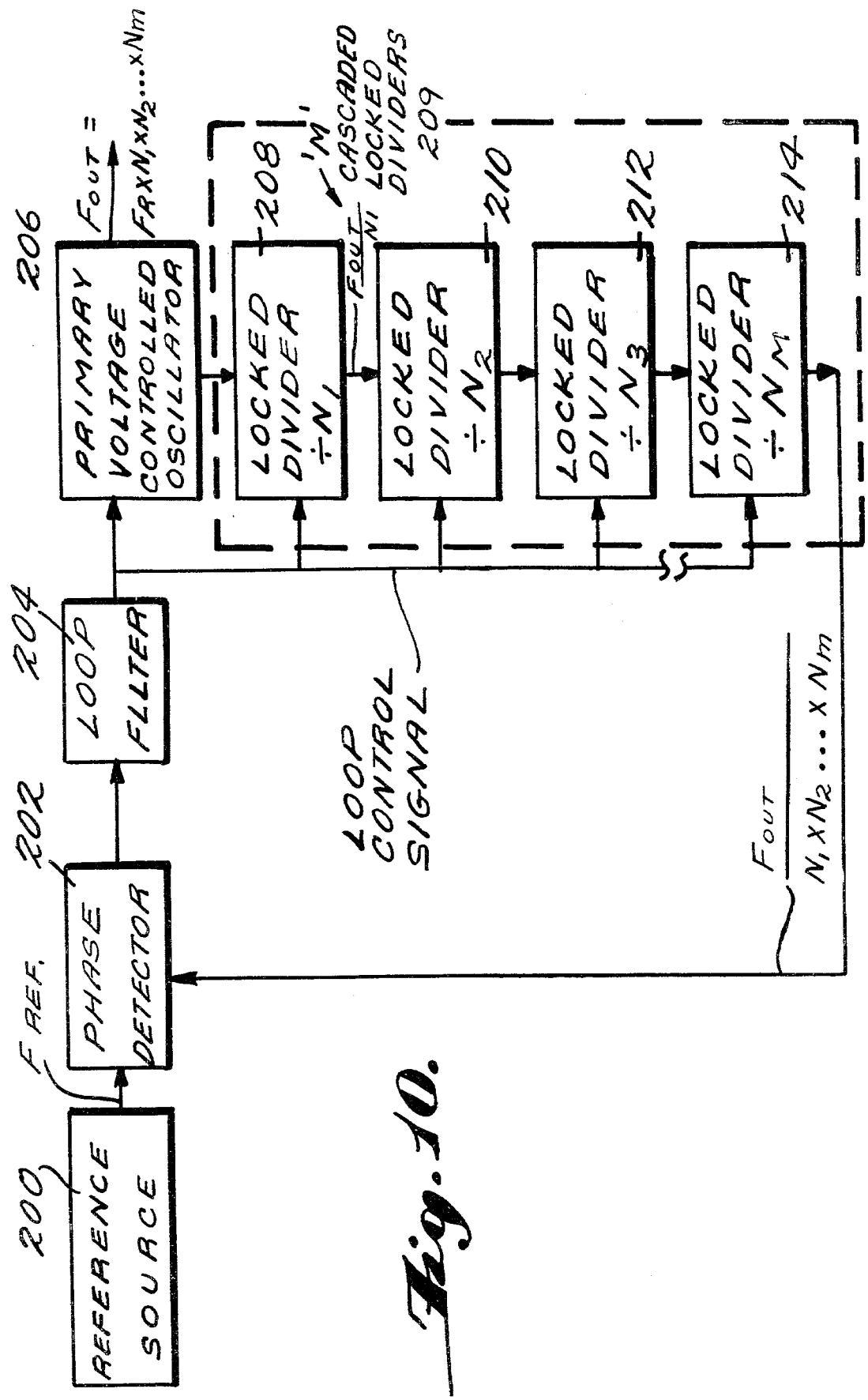
FIG. 10 is a block diagram of a phase-locked loop system having multiple locked oscillator divider stages, each controlled by the loop control signal.

In certain phase-locked loop designs, instead of using conventional dividers, it may be desirable to employ a cascade of injection locked VCO divider stages as shown in FIG. 10 to achieve higher division ratios and wider lock ranges.

Referring now to FIG. 10, there is shown such an arrangement. A reference source 200 provides a reference signal having frequency $R_{REF}$. The reference signal is coupled to one signal input of a phase detector 202. The second signal input to phase detector 202 is coupled to the signal output of M cascaded locked dividers 204. The output of phase detector 202, proportional to the phase difference between two signal inputs coupled thereto is coupled to a loop filter 204. The output of loop filter 204 provides a loop control signal for the phase-locked loop. The loop control signal from loop filter 204 is coupled to a primary voltage control oscillator 206. A first output of primary voltage control oscillator 206 is coupled to M cascaded locked dividers 209 including locked dividers 208, 210, 212 and 214. Locked divider 208 is a divide by $N_1$. Locked divider 210 is a divide by $N_2$. Locked divider 212 is divide by $N_3$, and locked divider 214 is a divide by $N_m$. Locked dividers 208...214 are coupled in series cascade with one another so that the output of each is coupled to the input of the next divider. Any number of dividers can be included between locked divider 212 and lock divider 214 as indicated by the broken lines in the Figure. The loop control signal is coupled to each of the locked dividers. Thus, the signal output from locked divider 214 is equal to the output frequency of primary voltage control oscillator 206 is divided by $N_1 \times N_2 \ldots \times N_m$. This output signal from lock divider 214 is coupled to the second signal input of phase detector 202. A second output of primary voltage control oscillator 206 provides the output signal for the phase-locked loop and has a frequency $F_{OUT} = F_R \times N_1 \times N_2 \ldots \times N_m$.

Therefore it is apparent that there has been provided a phase-locked loop for operation at UHF frequencies. A specific embodiment for the injection-synchronized voltage controlled oscillator 46 has been shown in FIG. 3. A detailed explanation of the basic design principles relating to voltage controlled oscillator 46 has been provided with FIGS. 4–9 so that one of ordinary skill in the art can apply these principles in order to design appropriate alternative embodiments for specific applications, as needed.

For example, other phase-locked loop arrangements can be made utilizing both an injection-synchronized voltage controlled oscillator in combination with a conventional divider. If the divide ratio of the injection-synchronized voltage controlled oscillator is M and the divide ratio of a conventional divider in series therewith is N, the cumulative divide ratio would be M×N.

As another example, an injection-synchronized oscillator that is not voltage controlled could be used in place of oscillator 46. Such an oscillator would be injection-synchronized to a sub-harmonic of primary voltage controlled oscillator 40 even though it would not track in response to the VCO control signal.

Obviously, even further embodiments and modifications of the present invention will readily come to those of ordinary skill in the art having the benefit of the teachings presented in the foregoing description and drawings. It is therefore, to be understood that this invention is not to be limited thereto and that said modifications and embodiment are intended to be included within the scope of the appended claims.

What is claimed is:

1. A phase-locked loop circuit comprising:
   a loop phase detector including a first signal input for coupling to a reference source, a second signal input, and a signal output for providing a signal related to the phase difference between the signals coupled to said first and second signal inputs;
   a loop filter coupled to the output of said phase detector for providing a loop control signal;
   a first signal controlled frequency source including a control input coupled to said loop control signal, for providing an output signal that is frequency dependent upon said control signal; and
   a second signal controlled frequency source including a first control input coupled to said loop control signal and a second control input coupled to the output of said first signal controlled frequency source for providing an output to said second signal input of said loop phase detector, said second signal controlled frequency source being synchronized, via the signal from said first signal controlled frequency source to its second control input, to a sub-harmonic of the output frequency of said first signal controlled frequency source whereby said second signal controlled frequency source functions in said phase-locked loop as a divider having a divide ratio equal to the sub-harmonic onto which it is synchronized.

2. A phase-locked loop circuit according to claim 1 wherein said first signal controlled frequency source comprises a voltage controlled oscillator.

3. A phase-locked loop circuit according to claim 1 or 2 wherein said second signal controlled frequency source comprises a second voltage controlled oscillator.

4. A phase-locked loop circuit according to claim 1 wherein said second signal controlled frequency source comprises a relaxation oscillator.

5. A phase-locked loop circuit according to claim 3 wherein said second voltage-controlled oscillator comprises a relaxation oscillator.

6. A phase-locked loop circuit according to claim 1 further including means for modulating the reference source, thereby modulating the output signal of said first signal controlled frequency source.

7. A phase-locked loop circuit according to claim 1 further including means for modulating said first signal controlled frequency source, thereby modulating the output signal of said first signal controlled frequency source.

8. A phase-locked loop circuit according to claim 1 further including means for modulating both the reference source and said first signal controlled frequency source, thereby modulating the output signal of said first signal controlled frequency source.

9. A phase-locked loop circuit according to claim 1, 2, 4, 6, 7, or 8 wherein said second signal controlled frequency source is frequency tuned by an RF diode.

10. A phase-locked loop circuit according to claim 3 wherein said second voltage controlled oscillator is frequency tuned by an RF diode.

11. A phase-locked loop circuit according to claim 5 wherein said relaxation oscillator is frequency tuned by an RF diode.

12. A phase-locked loop according to claim 1, 2, 4, 6, 7, or 8 wherein said second signal controlled frequency source is frequency tuned by a VARICAP.

13. A phase-locked loop circuit according to claim 3 wherein said second voltage controlled oscillator is frequency tuned by a VARICAP.

14. A phase-locked loop circuit according to claim 5 wherein said relaxation oscillator is frequency tuned by a varicap.

15. A phase-locked loop circuit according to claim 1 wherein said second signal controlled frequency source comprises:
a differential amplifier including a pair of inputs and a signal output circuit for generating the output signal of the said second signal controlled frequency source;
means for coupling an injection signal to said differential amplifier;
a feedback network coupled from the output circuit of said differential amplifier circuit to the inputs thereof for feeding back to the input a sub-harmonic of the frequency of said first signal controlled frequency source; and
means coupled to the output circuit of said differential amplifier for varying, in response to the loop control signal, the impedance thereof thereby changing the output frequency of said second signal controlled frequency source in response to the loop control signal.

16. In a phase-locked loop of the type including a first voltage controlled oscillator, a reference signal source, a divider coupled to the output of the first voltage controlled oscillator a phase detector for comparing the phase of the divided signal from the first voltage controlled oscillator with the phase of the reference signal and for generating a signal proportional to the phase difference therebetween, and a loop filter coupled to the output of the phase detector for generating a control signal for controlling the frequency of the first voltage controlled oscillator, the improvement comprising utilizing as said divider, a second voltage controlled oscillator that is injection locked to a sub-harmonic of the frequency of the first voltage controlled oscillator.

17. An improvement according to claim 16 wherein said second voltage controlled oscillator comprises a relaxation oscillator.

18. An improvement according to claim 16 wherein said second voltage controlled oscillator is frequency tuned by an RF diode.

19. An improvement according to claim 16 wherein said second voltage controlled oscillator is frequency tuned by a varicap.

20. An improvement according to claim 16 wherein said second voltage controlled oscillator comprises:
a differential amplifier including a pair of inputs and a collector circuit for generating the output signal of said second voltage controlled oscillator;
means for coupling an injection signal to said differential amplifier;
a feedback network coupled from said collector circuit of said differential amplifier to the inputs thereof for feeding back to the inputs a sub-harmonic of the injection frequency; and
means coupled to said collector circuit of said differential amplifier for varying, in response to a VCO control signal, the impedance of the collector circuit thereby changing the output frequency of said second voltage controlled oscillator in response to said VCO control signal.

21. In a method for generating a signal that is phase locked to a multiple of a reference source frequency and which is the Nth multiple of the reference source frequency comprising the steps of
generating a reference signal having a predetermined reference frequency;
generating a voltage controlled oscillator signal
dividing the voltage control oscillator signal by N;
detecting the phase difference between the reference source signal and the divided voltage controlled oscillator signal and generating in response thereto a phase difference signal; and
filtering the phase difference signal to produce a control signal for controlling the frequency of the voltage controlled oscillator, the improvement wherein said step of dividing comprises the steps of:
injection locking of a second voltage controlled oscillator to the Nth sub-harmonic of the frequency of the first voltage controlled oscillator; and
controlling the second voltage controlled oscillator with the same control signal that is utilized to control the first voltage controlled oscillator.

22. A phase-locked loop system comprising:
a reference signal source;
a phase detector;
a first signal controlled oscillator;
a second signal controlled oscillator;
said phase detector being responsive to signals received from said reference source and said second signal controlled oscillator for providing a comparator output signal which is a function of the phase difference between the signals received from said reference signal source and said second signal controlled oscillator;
means for modifying the frequency of said first signal controlled oscillator as a function of said comparator output signal;
means for modifying the frequency of said second signal controlled oscillator as a function of said comparator output signal and said modified frequency signals received from said first signal controlled oscillator;
means for causing said second signal controlled oscillator to function in said phase-locked loop system as a frequency divider comprising said second signal controlled oscillator being synchronized to a sub-harmonic of the modified frequency signals received from said first signal controlled oscillator; and means for providing an output from said first signal controlled oscillator.

23. A phase-locked loop system according to claim 22 wherein said second signal controlled oscillator comprises a plurality of such frequency divider circuits connected in cascade; and means for applying said comparator output signal to selected ones of said frequency divider circuits to modify the frequency of the signals developed by said frequency divider circuits.

24. A phase-locked loop circuit comprising:

a loop phase detector including a first signal input for coupling to a reference source, a second signal input, and a signal output for providing a signal related to the phase difference between the signals coupled to said first and second signal inputs;

a loop filter coupled to said output of said phase detector for providing a loop control signal;

a first signal controlled frequency source including a control input coupled to said loop control signal, and for providing an output signal that is frequency dependent upon said control signal; and a cascade of dividers coupled to an output of said first signal controlled frequency source, said cascade of dividers including at least one signal controlled frequency source having a free running frequency that is controlled by said loop control signal and that is synchronized via the signal from said first signal controlled frequency source to a sub-harmonic of the output frequency of said first signal controlled frequency source, whereby said cascade of dividers functions in said phase-locked loop as a divider.

25. A phase-locked loop circuit according to claim 24 wherein said at least one signal controlled frequency source comprises a voltage controlled oscillator coupled to and controlled by said loop control signal and being injection synchronized via the signal from said first signal controlled frequency source.

26. A phase-locked loop circuit according to claim 24 wherein said cascade of dividers includes at least one divider that is not controlled by said loop control signal and is not injection synchronized.

27. A phase-locked loop circuit according to claim 24 wherein said first signal controlled frequency source comprises a voltage controlled oscillator.

* * * * *